United States Patent [19]

Angelini et al.

[11] Patent Number: 4,459,338

[45] Date of Patent: Jul. 10, 1984

[54] METHOD OF DEPOSITION OF SILICON CARBIDE LAYERS ON SUBSTRATES AND PRODUCT

[75] Inventors: Peter Angelini, Oak Ridge; Charles E. DeVore, Knoxville; Walter J. Lackey; Raymond E. Blanco, both of Oak Ridge; David P. Stinton, Knoxville, all of Tenn.

[73] Assignee: The United States of America as represented by the United States Department of Energy, Washington, D.C.

[21] Appl. No.: 360,116

[22] Filed: Mar. 19, 1982

[51] Int. Cl.$^3$ ............................ B32B 5/16; B32B 9/00
[52] U.S. Cl. .................................... 428/404; 427/215; 427/249; 427/255; 428/218
[58] Field of Search ...................... 427/249, 95, 255.1, 427/255.7, 215, 255; 428/446, 448, 404, 218

[56] References Cited

U.S. PATENT DOCUMENTS

| | | | |
|---|---|---|---|
| 3,382,113 | 5/1968 | Ebert et al. | 427/249 |
| 3,386,866 | 6/1968 | Ebert et al. | 427/249 |
| 3,736,169 | 5/1973 | Graham et al. | 427/249 |

FOREIGN PATENT DOCUMENTS 2157145  5/1972  Fed. Rep. of Germany ...... 427/249

OTHER PUBLICATIONS

Marinare, "Thin Films of a Silicon-Carbon Compound", IBM Tech. Discl. Bulletin, vol. 17, No. 10, Mar. 1975.

Lauf et al., "Characterization of SiC Coatings on HTGR Fuel Particles", Union Carbide Corp., Jan. 1981.

*Primary Examiner*—Sadie L. Childs
*Attorney, Agent, or Firm*—Earl L. Larcher; Stephen D. Hamel; Michael F. Esposito

[57] ABSTRACT

A method for direct chemical vapor deposition of silicon carbide to substrates, especially nuclear waste particles, is provided by the thermal decomposition of methylsilane at about 800° C. to 1050° C. when the substrates have been confined within a suitable coating environment.

7 Claims, 2 Drawing Figures

METHOD OF DEPOSITION OF SILICON CARBIDE LAYERS ON SUBSTRATES AND PRODUCT

The invention is a result of a contract with the U.S. Department of Energy.

BACKGROUND OF THE INVENTION

This invention relates to the ceramic arts and, more particularly, it relates to a method for chemical vapor deposition (CVD) of silicon carbide (SiC) coatings onto ceramic substrates.

In the art, coatings of SiC by CVD have been applied to nuclear fuel particles to provide structural integrity, radiation resistance, and fission product retention upon exposure to intense radiation within a reactor environment. Typical fuel coatings comprise an inner layer of pyrolytic carbon (PyC), a dense middle layer of PyC, and a dense outer layer of SiC. If desired, additional coatings of PyC, SiC, $Al_2O_3$ and similar refractory compounds may be applied for greater mechanical strength and reactor environment inertness.

Customarily, these coating operations are conducted in fluidized-bed coating units during batch-wise operations. Gaseous feeds thereto include appropriate donor gases, inert gases, and carbon sources that provide a desired coating layer through CVD. Pyrolytic carbon coatings are applied first to nuclear fuels at about 1000° C. to 1200° C. Thereafter, SiC coatings are applied within a temperature range of about 1500° C. to 1600° C. using methyltrichlorosilane (MTS) as the SiC donor gas and hydrogen as the fluidizing gas. Corrosive gases such as HCl, $Cl_2$, and the like are evolved upon thermal decomposition of the MTS.

Recently, the above-described technology has been applied to nuclear waste forms derived by sol-gel type operations to effect multi-barrier consolidations of high-level radioactive wastes. Precise details for such procedures may be found in a commonly assigned U.S. patent application entitled "Method For Fixation and Containment of Nuclear Wastes", Ser. No. 217,359 deposited Dec. 17, 1980 in the names of Peter Angelini, et al. The pertinent contents of that patent application have also been published in "Sol-Gel Technology Applied To Glass and Crystalline Ceramics", Waste Management Symposium 1980, Vol. 2, pp. 391-417, Tucson, Ariz. (Mar. 9-14, 1980). Inasmuch as these teachings may be utilized to provide a solidified waste form which can be employed in the method of the present invention to achieve significant improvements in the requisite chemical and mechanical properties for an ultimate waste form containing high level radioactive wastes, the foregoing patent application and publication are incorporated herein by reference.

While it may appear from the aforementioned teachings that prior experience with coated nuclear fuels may be applied to solidified forms of nuclear waste to achieve CVD coatings, the unpredictable behavior of nuclear wastes makes such an adaption difficult. In actual practice, the complex compositions and multiphase systems of nuclear wastes respond quite differently to thermal and environmental conditions customarily employed for coating the relatively pure phase systems of one or two metal constituents present in nuclear fuels. For example, nuclear waste particles melt several hundreds of degrees lower than nuclear fuel materials and are usually molten at the typical PyC (1300° C.) or SiC (1550° C.) deposition temperatures utilized for fuel coatings.

Another problem associated with coating nuclear waste has been the inability to achieve large volumetric reductions by producing forms having high concentrations. An even more troublesome problem has been the adverse reactions between contents and components of the coating unit, including the nuclear waste particles, and the decomposition products of gases utilized in fuel fabrication technology. Finally, the application of fuel coatings to nuclear waste forms have produced less than satisfactory leach resistance. Based upon prior experience, the leach resistance of coated nuclear wastes is about two orders of magnitude lower and is the direct result of the aforemetioned problems.

FIG. 1 is a photograph of a typical fuel-type coated nuclear waste containing about 90% nuclear waste. As is apparent therein, deleterious reactions have taken place within the kernel and between the kernel and the PyC coating during the coating process causing voids, surface abnormalities, and structural distortions. These defects may have a deleterious effect on integrity and long-term service life of the particles. For example, the core area of the structures does not appear uniform indicating melting and possible loss of radioactive species by mechanisms such as volatilization or migration into adjoining layers. Since the distorted shape and penetrated coating layers visible in FIG. 1 may provide potential pathways for subsequent chemical or physical damage, the suitability of these particles as an ultimate solidified nuclear wastes is doubtful. It has also been found that other substrates, of which nuclear waste forms are but one species, are also incompatible with known CVD technology for nuclear fuels for the reasons given above.

Accordingly, it is desired to develop a method for coating substrates to provide an essentially insoluble and inert barrier of nonreactive refractory compounds which is compatible therewith while maintaining the substrate in a stable condition. It is also contemplated that the resultant coated substrate will possess a significant improvement in chemical and mechanical properties.

As used herein, the term "substrate" shall include solidified nuclear waste particles derived by sol-gel type and other waste solidification processes as well as more conventional articles to which the application of SiC coatings by CVD may appear desirable.

Other substrates to which the method of the present invention may be applied to provide SiC coatings include valve seats and bonnets, pump impellers, working surfaces of advanced power plants, and wear surfaces in equipment for coal liquefaction and conversion processes.

SUMMARY OF THE INVENTION

It is an object of the present invention to provide a method for applying coatings to substrates by CVD whereby inert or refractory compound coatings of high effectiveness and sound integrity are permanently imparted to the particles.

It is an additional object of this invention to provide such a method wherein a coating of silicon carbide is directly applied to the substrate without utilization of preliminary coatings of PyC.

It is a further object of this invention to provide a method of the character described above which is compatible with particles of nuclear wastes containing high concentrations of radioactive elements in excess of about 70 wt. %.

These objects and other advantages, which will become apparent from a thorough reading of this disclosure, are accomplished in accordance with the present invention by provision of a method for direct application of CVD coatings of SiC to substrates confined within a coating environment comprising the decomposing of methylsilane in the presence of the substrates under conditions suitable for methylsilane conversion into a donor of C and Si to effect an essentially uniform coating of SiC on the substrates.

DETAILED DESCRIPTION OF THE INVENTION

Figure 1:
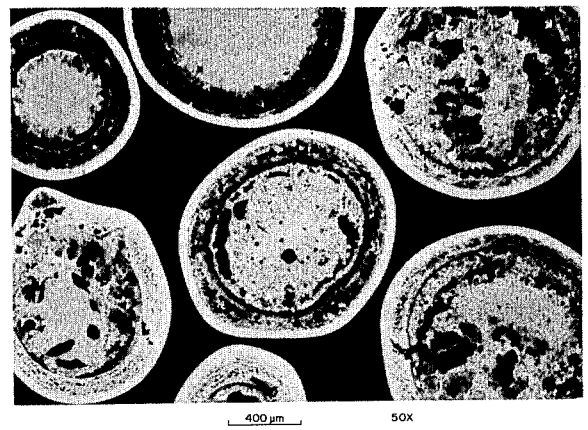
FIG. 1 is a photograph (50X) of coated particles prepared in accordance with the teachings of the prior art and contain about 90 wt. % nuclear wastes.

The present invention is predicated upon our discovery that coatings of SiC can be directly applied to substrates of relatively low melting points by thermal decomposition of methylsilane ($CH_3SiH_3$). The substitution of methylsilane for methyltrichlorosilane ($CH_3SiCl_3$) solves several inherent problems with heretofore utilized fuel coating technology. A first application of a buffer coating of SiC in accordance with the present invention eliminates the former use of directly applied PyC coatings which had to be applied under potentially explosive hydrogen concentrations or under thermal conditions at which the substrate might be rendered unstable or molten. Additionally, objectionable concentrations of HCl, $Cl_2$, and $H_2$ which might attack process equipment or the substrate being coated are obviated by the use of methylsilane in the present invention. Further, equipment and additive chemicals formerly necessary to neutralize the decomposition products of MTS are unnecessary in the subject method thereby reducing waste treatment costs as well. Finally, the subject method can be readily accomplished at a temperature of about 900° C., a temperature below the melting point of many substrates such as solidified nuclear waste particles, and is much preferred over the high temperature processes of the art.

The direct application of layers of SiC by CVD processes is unknown in the art of fabrication of coated nuclear wastes. Such coatings can be readily accomplished in accordance with the present invention utilizing methylsilane in a suitable coating environment at a temperature within the range of 700° C. to 1100° C. A preferred range for application of such coatings is about 800° C. to 1050° C. Operating temperatures much below about 800° C. tend to produce amorphous SiC which is not as mechanically or chemically acceptable as crystalline, single phase SiC. Temperatures in excess of about 1050° C. are normally unnecessary to accomplish efficient deposition of SiC coatings with methylsilane and may increase the risk of escape of volatile species from nuclear waste particles such as those containing Cs, Sr, Ru, Mo, and others.

The method of the present invention may be effected by confinement of the substrate within a conventional CVD unit such as a fluidized bed coater, a drum coater, or a vibrating bed furnace. Conventional mechanisms may be used for introducing gaseous feeds of about one part methylsilane to about 160 parts of an inert gas selected from the group consisting of argon, helium, nitrogen, and mixtures thereof.

Dependent upon the ultimate application, the SiC-coated substrate may require additional layers or coatings. Therefore, the present method envisions the applications of at least one layer of SiC while confined in the coating unit. Additional layers of SiC may be applied under identical conditions as the first layer described above. Additional coatings of any number of different compounds or elements may then be applied by selective variation of gaseous feeds to the coating unit. For example, pyrolytic coatings of other stable carbides like Cr, Ti, W, and Zr may be applied in accordance with the present method by replacement of methylsilane with an effective precursor for the desired metal carbide. Typical precursor compounds could be the chloride or fluoride salts of the selected metals.

PyC coatings can also be applied to the SiC-coated substrate utilizing appropriate carbon donor gases, such as acetylene and propylene gas, but preferably propylene, because the propylene reaction is endothermic.

When nuclear waste forms are being coated in accordance with the method of the present invention, we have found it preferable to apply an inner low density "buffer" layer of SiC, a dense middle layer of SiC, and an outer layer of PyC. This impervious outer coating of PyC significantly increases the leach resistance and mechanical integrity of SiC-coated waste forms. If additional abrasion or oxidation resistance is required for handling or storing the ultimate coated waste form, or mandated by transportation or repository authorities, an additional coating of SiC may be applied to protect the PyC from oxidation during transportation accident fires.

In applying our waste coating, a low density, porous buffer layer of about 40% theoretical density SiC is applied by using a fast coating rate of about 1 to 5 microns per minute with about 2 to 3 microns per minute preferred. The low-density SiC buffer layer ranges from about 1.0 to 2.5 $g/cm^3$ with 1.9 to 2.1 $g/cm^3$ preferred. Over this buffer layer we then apply one or more layers of SiC of about 98% theoretical density by utilizing a slower coating rate of about 0.05 to 0.5 micron per minute with about 0.1 to 0.3 micron per minute preferred. These intermediate SiC coatings have a density which ranges from about 2.5 to 3.2 $g/cm^3$ with 3.0 to 3.2 $g/cm^3$ being preferred. An outer layer of PyC is then applied as a dense coating of about 2.0 $g/cm^3$. Either isotropic or anisotropic PyC coatings can be applied according to the method of the present invention. A further layer of SiC may also be applied over this outer PyC layer as aforementioned by utilizing a SiC coating rate of about 0.1 to 0.3 micron/minute. The foregoing procedures usually provide solidified forms of nuclear wastes with coating layers of thickness of about 10 to 50 microns. Thus, the ultimate waste form will have an overall coating thickness of about 30 to 150 microns.

When coating substrates other than nuclear waste forms, the types of coatings, coating rates, and coating densities may vary somewhat from those described above but may readily be determined by the application of replicate skills to achieve an ultimate coated article suitable for the intended application. For instance, the use of inert or refractory compound coatings applied in accordance with the present invention has potential in a variety of situations calling for engineering materials to withstand exposure to corrosive, abrasive, or high temperature environments. Such environments may be found in advanced energy systems, synfuels plants, and fossil fuel combustion or liquifaction plants to name only a few.

To further demonstrate the method of the present invention for applying SiC coatings to substrates, the following experiments were performed by way of example. Because application of known fuel-type coatings to nuclear waste particles containing in excess of about 70 wt. % nuclear waste resulted in severe reactions (with PyC), these substrates were selected to demonstrate the present invention on a suitability for worst possible substrate bases. Table I hereinafter includes details about chemical compositions of the simulated wastes and ultimate, solidified waste forms.

EXAMPLE I

A batch of solidifed particles of nuclear wastes was prepared in accordance with the aforementioned teachings by sol-gel type operations. The final particles contained about 90 wt. % nuclear wastes and about 10 wt. % $ZrO_2$ in accordance with Table I. Because structural elements, such as Fe, Al, and the like, comprise up to about 98 wt. % of nuclear waste, the Al content of the simulated waste was preliminarily removed in accordance with envisioned management practices for volumetric reduction of nuclear wastes. These concentrated waste forms are highly desirable for conservation of space within geological formations, the anticipated permanent repository of nuclear wastes.

In accordance with the present invention, a batch of the waste particles was confined within a CVD coating unit, Ar was supplied as the fluidizing gas, and methylsilane was thermally decomposed therein at a temperature of about 1050° C. to effect a CVD buffer coating of relatively low-density SiC of about 30 microns in thickness in about 10 minutes coating time. A denser SiC layer was then applied over the SiC layer on the particle of nuclear waste at about 900° C. to provide an additional coating thickness of about 20 microns in about 120 minutes.

Thermal tests were performed in various atmospheres using a thermogravimetric system to determine the thermal stability of these SiC coated particles. Comparable tests were also performed in a controlled atmosphere furnace utilizing inert and reducing atmospheres. The results for percent weight loss, percent coating loss, and evolved gases were indeterminate and assumed to be zero for oxidation tests at about 800° C. for a thirty-minute duration to simulate a transportation accident fire. Comparable results in inert or reducing atmospheres at 1200° C. for two hours were also obtained. These tests conclusively established that SiC-coated waste forms are stable to over 1200° C. and can survive such conditions even though the melting point of nuclear wastes contained therein may be exceeded. Thereafter, a third layer of dense PyC was applied over the two SiC layers using propylene as the coating gas and argon as the fluidizing gas at about 1200° C. to provide a PyC coating of about 15 microns in about 60 minutes.

Figure 2:
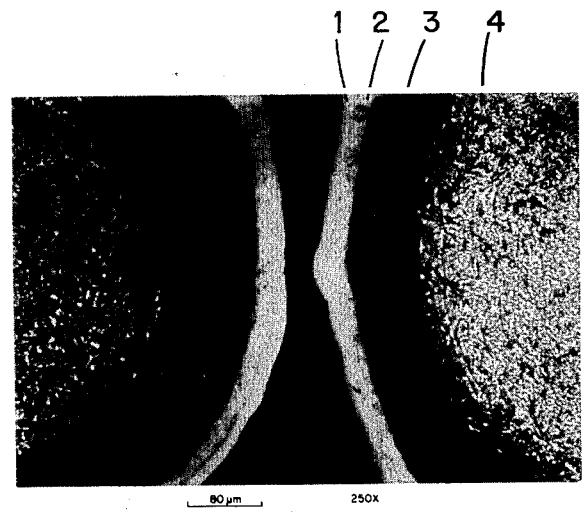
FIG. 2 is a photograph (250X) of coated particles prepared by practicing the present invention containing about 90 wt. % nuclear wastes.

In our waste particle configurations, the innermost layer of SiC functions as a buffer to accommodate disparities in thermal expansion of the nuclear waste particle as compared to the outer layer of the coating. Therefore, we have found the application of a second layer of SiC in our coating provides a gas-tight seal and physical, leach resistant barrier of sound integrity between the waste particle and the subsequently applied PyC. The layer of (PyC) in our coating method functions as an impervious and leach resistant barrier and retentive mechanical structure to prevent penetration or escape by hazardous radiation products. FIG. 2 is a photograph (250X) of coated waste particles prepared in accordance with the method of the present invention. The particles shown therein are of good quality and sound integrity. Coating characteristics were studied by mercury porosimetry, immersion density, ceramography, aqueous leaching, and gaseous chlorine leaching at the completion of the PyC coating stage. These tests confirmed that the subject method produces failsafe coatings for solidified forms of nuclear wastes.

EXAMPLE II

A sufficient amount of nuclear waste was added to sol-gel solutions to achieve a 70 wt. % loading of nuclear waste in the ultimate particle. The balance of the particle was comprised of additives of CaO, $SiO_2$, $Na_2O$, $TiO_2$, and $ZrO_2$ as listed in Table 1.

After coating the particles with SiC according to our method, a portion of the coated waste particles was subjected to aqueous leach tests developed by the Materials Characterization Center of Pacific Northwest Laboratory of the U.S. Department of Energy. Deionized water at a temperature of about 90° C. was utilized for 3, 7, 14, and 28 day durations to determine leach resistance of the coated wastes. Uncoated samples were also subjected to the same tests. No differences were measured for the pH and EH values of the solutions used in the coated particle tests indicating the absence of leaching. The solutions exposed to the uncoated particles experienced changes in pH and EH values indicating the existence of leaching. The summarized results of these tests are given in Table II. As indicated therein, detection of leached elements from particles coated in accordance with the present invention was beyond the limit of measurement for such highly sensitive analytical methods as inductively coupled plasma atomic emission for all of the elements except Cs and atomic absorption for detection of Cs. The leach rates reported for the current invention are several orders of magnitude lower than currently reported results for the leaching of the same elements in other waste forms such as glass and ceramic alternates.

A second portion of these coated nuclear waste forms was successfully overcoated with PyC and subjected to a highly corrosive leach utilizing gaseous chlorine at about 1000° C. After four hours of exposure, we did not detect any adverse effects on the coated nuclear waste forms. Exposure of uncoated particles would result in their destruction by the formation of volatile chlorides under similar conditions.

TABLES I AND II

It will be seen that the coated nuclear waste forms provided by practicing the method of the present invention are suitable as multibarrier articles which can be consolidated into conventional processes for disposing of nuclear wastes, such as dispersions within or feeds to glass, asphalt, cement, concrete, metal, and alternate ceramic systems. Former concerns of the art regarding loss of volatile or leachable species during operations to process, handle, package and store nuclear waste forms are obviated by the method of the present invention. Inasmuch as coated waste forms prepared in accordance with the present invention contain greater nuclear waste concentrations per unit volume than conventional waste forms, the present invention provides a more economical and efficient process for nuclear waste isolation and disposal than heretofore available. Because our SiC and PyC coatings are applied at gas concentrations below explosive limits if exposed to air, any number of gases may be utilized while avoiding coating-to-particle interaction by maintaining temperatures below about 1200° C. These features permit safe operation within remotely operated and maintained facilities utilized for nuclear waste processing.

TABLE I

WASTE AND PRODUCT COMPOSITIONS

| Component | SRP[a] waste sludge | Example I[b] Additives | Example I[b] Product | Example II[c] Additives | Example II[c] Product |
|---|---|---|---|---|---|
| $Fe_2O_3$ | 49.9 | | 44.9 | | 35.8 |
| $Al_2O_3$ | 9.8 | | 8.8 | | 7.0 |
| $MnO_2$ | 13.7 | | 12.4 | | 9.9 |
| $U_3O_8$ | 4.5 | | 4.1 | | 3.2 |
| CaO | 3.7 | | 3.3 | 18.0 | 7.7 |
| NiO | 6.2 | | 5.6 | | 4.4 |
| $SiO_2$ | 1.2 | | 1.1 | 21.2 | 6.7 |
| $Na_2O$ | 7.0 | | 6.3 | 9.9 | 7.9 |
| $Na_2SO_4$ | 1.3 | | 1.2 | | 0.9 |
| $Ce_2O_3$ | 1.1 | | 0.9 | | 0.8 |
| $Nd_2O_3$ | 1.1 | | 0.9 | | 0.8 |
| SrO | 0.5 | | 0.5 | | 0.4 |
| $TiO_2$ | | | | 39.1 | 11.0 |
| $ZrO_2$ | | 100 | 10.0 | 11.8 | 3.3 |

[a]SRP (Savannah River Plant) waste with aluminum removed and normalized to compensate for removal of zeolite and addition of $Ce_2O_3$, SrO, and $Nd_2O_3$.
[b]90/10 (90 wt. % simulated SRP composite waste with aluminum removed plus 10 wt. % $ZrO_2$).
[c]70/30 (70 wt. % simulated SRP composite waste with aluminum removal plus 30 wt. % additives)

TABLE II

LEACH TEST RESULTS FOR COATED AND UNCOATED PARTICLES

| Element | Detection[a] Limit | Uncoated 70/30 3-Day | Coated 70/30 3-Day |
|---|---|---|---|
| Fe | $3 \times 10^{-5}$ | $7 \times 10^{-3}$ | b |
| Al | $1 \times 10^{-4}$ | $6 \times 10^{-3}$ | b |
| Mn | $2 \times 10^{-5}$ | $2 \times 10^{-3}$ | b |
| U | $1 \times 10^{-5}$ | $3 \times 10^{-3}$ | b |
| Ca | $2 \times 10^{-4}$ | $5 \times 10^{-2}$ | b |
| Ni | $4 \times 10^{-5}$ | $2 \times 10^{-3}$ | b |
| Si | | | b |
| Na | $6 \times 10^{-4}$ | $3 \times 10^{-3}$ | b |
| Zr | $2 \times 10^{-5}$ | $2 \times 10^{-4}$ | b |
| Ti | $5 \times 10^{-6}$ | $9 \times 10^{-4}$ | b |
| Ba | | | b |
| Mo | | | b |
| Ce | $4 \times 10^{-4}$ | $4 \times 10^{-3}$ | b |
| Nd | | | b |
| Sr | $1 \times 10^{-5}$ | $8 \times 10^{-2}$ | b |
| Cs | $1 \times 10^{-3}$ | | b |

[a]Leach test MCC-1; deionized $H_2O$; 90° C.; Teflon containers. Detection limit determined by averaging blanks submitted during test ($V_{sol}$ = 20 cm$^3$, T = 5 days, SA = $75 \times 10^{-4}$ m$^2$).
[b]Below detection limit.
Leach Rate = $LR_i$ = $M_i/(f_i \times SA \times t)$
where
$LR_i$ = leach rate of element i
$M_i$ = mass of element is solution (g),
$f_i$ = fraction of element in sample,
SA = surface area of sample (m$^2$), and
t = time period of leach (days).

What is claimed is:

1. A method for providing a nuclear waste particle with a coating consisting of crystalline silicon carbide directly on exposed surfaces thereof, comprising the steps of contacting the particle with a gaseous mixture of methylsilane in an inert gas selected from the group consisting of argon, helium, nitrogen and mixtures thereof while concurrently heating the gaseous mixture and the particle to a temperature in the range of about 800° to 1,050° C. to effect the thermal decomposition of the methylsilane for providing carbon and silicon donors for forming silicon carbide and the chemical vapor deposition of these carbon and silicon donors onto said exposed surfaces as an essentially uniform coating of crystalline silicon carbide on said particle.

2. The method claimed in claim 1 wherein said steps are repeated to form the coating from at least two layers of silicon carbide, and wherein the innermost layer is deposited in the particle at a more rapid growth rate than any subsequent layer to provide a coating of varying density.

3. The method claimed in claim 2 wherein the innermost layer is deposited on the particle at a growth rate in the range of about 1–5 microns per minute to provide the innermost layer with a density of about 40% of theoretical density, and wherein any subsequent layer of said coating is deposited on the innermost layer at a growth rate in the range of about 0.05–0.5 micron per minute to provide any subsequent layer with a density of about 98% of theoretical density.

4. The method claimed in claim 1 wherein the ratio of methylsilane to inert gas is about 1:160.

5. The product derived by the method of claim 1.

6. The product derived by the method of claim 2.

7. The product of claim 6 wherein the innermost layer is of a density of about 40% theoretical density, and wherein any other layer forming said coating is of a density of about 98% theoretical density.

* * * * *